MOUNTING ARRANGEMENT FOR SEMICONDUCTOR DEVICES

Filed Sept. 30, 1965 2 Sheets-Sheet 1

INVENTORS
DONALD D. BOCK
ALVIN L. GARDNER
BY Joseph V. Claeys
THEIR ATTORNEY

MOUNTING ARRANGEMENT FOR SEMICONDUCTOR DEVICES

Filed Sept. 30, 1965 2 Sheets-Sheet 2

INVENTORS
DONALD D. BOCK
ALVIN L. GARDNER
BY Joseph V. Claeys
THEIR ATTORNEY 3,377,524

MOUNTING ARRANGEMENT FOR SEMICONDUCTOR DEVICES

Donald D. Bock and Alvin L. Gardner, Erie, Pa., assignors to General Electric Company, a corporation of New York Filed Sept. 30, 1965, Ser. No. 491,580
10 Claims. (Cl. 317—234)

ABSTRACT OF THE DISCLOSURE

The invention is directed to a mounting of a semiconductor device on a heat sink by means of a thermally conducting intermediate body that, while electrically insulated from the heat sink, transfers heat from the semiconductor device to the heat sink.

The present invention relates to apparatus for cooling semiconductor devices and more specifically to an arrangement for mounting such devices in which the device is removably mounted to a thermal dissipating means.

It is well known that successful application of a semiconductor device depends to a great extent on adequate cooling of the semiconductor device. For example, if the P-N junction temperature of a typical semiconductor device rises high enough, permanent changes may occur in its characteristics or the device may fail by melting or thermal runaway. Further, circuits utilizing such semiconductor devices may fail before melting or thermal runaway occurs since insufficient cooling thereof can reduce the operating characteristics of the semiconductor device, particularly the forward breakover voltage, sufficiently to induce circuit malfunction.

In a typical semiconductor mounting, a semiconductor device is generally attached to a threaded stud which in turn is attached to a heat dissipating means (commonly referred to as a heatsink). Generally, materials such as copper and aluminum which have high thermal conductivities have been used to dissipate heat developed in a semiconductor device. As, in most instances, the stud to which the semiconductor device is attached is electrically at the same potential as the semiconductor device, it is desirable to electrically insulate the stud from the heatsink.

Many known semiconductor device cooling arrangements have included a thin sheet of mica, or other suitable electrical insulation, disposed between the stud or semiconductor device and the heatsink in order to electrically isolate the heatsink from the stud or semiconductor device. Although being generally a satisfactory cooling arrangement, problems have arisen with this arrangement as it is sometimes necessary to repair or replace the semiconductor device. As the semiconductor device is usually in direct contact with the mica insulation, and as thin sheets of mica insulation are extremely fragile and subject to fracture when handled, such removal tends to damage or destroy the electrical insulating material. The desirability of providing an arrangement which permits repair or replacement of the semiconductor device without disturbing the electrically insulating material is manifest.

Therefore, one object of the present invention is to provide an improved arrangement for mounting a semiconductor device.

A further object of the present invention is to provide an arrangement for mounting a semiconductor device to an electrically isolated heatsink therefor wherein the semiconductor device is readily removable from the mounting without disturbing the electrically isolating means.

Briefly stated, in accordance with one aspect of this invention, an arrangement is provided for mounting the semiconductor device to the heat dissipating means through an intermediate body of high thermal conductivity which is in turn intimately and electrically insulatingly secured to the heat dissipating means. The intermediate body has a shank portion, to which the semiconductor device is adapted to be mounted in intimate thermal contact, and a head portion which provides an increased surface area which is disposed adjacent the heat dissipating means with a layer of electrically insulating material therebetween so that the head portion of the body is in a thermally conducting, electrically insulated relationship with the heat dissipating means whereby heat developed in the semiconductor device is transferred to the heat dissipating means.

Additional objects and advantages of the present invention together with a better understanding thereof may me had by referring to the following detailed description of the present invention together with the accompanying drawings wherein.

Figure 1:
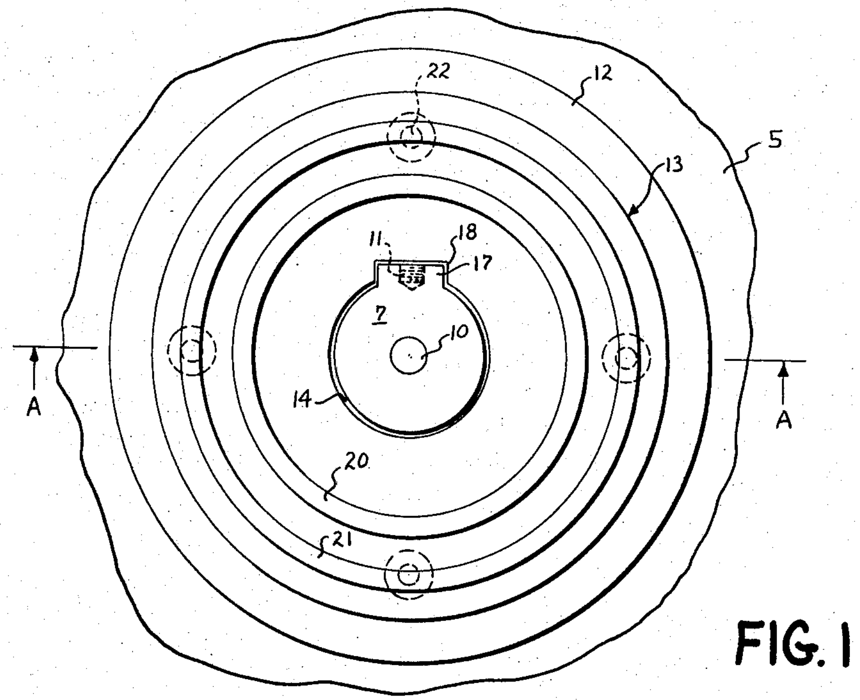
FIGURE 1 is a top view of one embodiment of the present invention.
Figure 2:
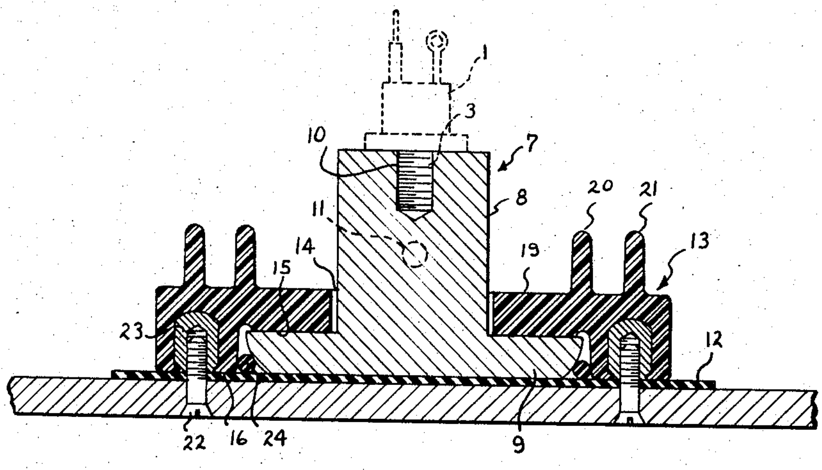
FIGURE 2 is a sectional view taken along the line A—A of FIGURE 1.

In FIGURES 1 and 2 there is shown an embodiment of the present invention including a semiconductor device 1 mounted on a threaded stud 3 which in turn is to be mounted to a suitable means for dissipating heat generated in the semiconductor device 1; this latter means being designated by the reference numeral 5 and referred to for convenience hereinafter as a heatsink. Ideally, heatsink 5 would include a sheet of material of good thermal conductivity having unbound dimensions. This type of "infinite" heatsink is most closely approached when the semiconductor device 1 is mounted to the chassis of an apparatus in which the semiconductor device is being utilized and which is generally made of copper, aluminum, or the like.

In accordance with this invention, means are provided for mounting semiconductor device 1 to heatsink 5 through an intermediate body 7 of copper, aluminum or other suitable high thermally conducting material. Intermediate body 7 is arranged to be in intimate thermal contact with semiconductor device 1 and in thermally conducting, electrically insulated relationship with heatsink 5. This arrangement provided for the required electrical isolation between the device and the heatsink while at the same time allowing for good transfer of the heat developed in the device to the heatsink.

In the arrangement shown, body 7 is provided with a shank portion 8 and a head portion 9. Shank portion 8 is provided with a threaded bore 10 which is adapted to receive the threaded stud 3 of semiconductor device 1 thereby providing for intimate thermal contact between the device and shank portion 8 so that heat developed in semiconductor device 1 is transferred to the body 7. A second threaded bore 11 in the side wall of shank portion 8 is provided to permit electrical connection to the semiconductor device.

Head portion 9 is arranged to be placed in thermally conducting relationship with heatsink 5 and electrically insulated therefrom by a suitable layer 12 of electrically insulating material. In order to allow for maximum heat transfer, layer 12 should be as thin as possible while still providing the electrical insulation required for the particular application. Ideally, in order to achieve maximum heat transfer between body 7 and heatsink 5, the electrical insulating material should combine good thermal conducting characteristics with good electrical insulating characteristics. It will be understood, of course, that if the electrical insulating properties of the material are sufficiently good that only a thin layer or sheet thereof need be employed to achieve the required electrical isolation, the thermal conducting properties become much less significant. Among the materials found to be satisfactory for high voltage applications are mica and polyimide film material both of which may be employed as very thin sheets and still exhibit high dielectric properties. The polyimide film material is available commercially under the trademark Kapton, from the E. I. Dupont de Nemours and Company.

Means are provided for securing the body 7 to heatsink 5 which, in the arrangement illustrated, includes an annular member 13 of a suitable electrically nonconducting material such as, for example, a polycarbonate resin which is sold under the trademark Lexan by the General Electric Company. Member 13 has an opening 14 therethrough with a counterbore 15 formed in the inside surface 16 of the member. The shank portion 8 of body 7 projects through the opening 14 with the head portion 9 disposed in counterbore 15. Counterbore 15 is arranged so that when the body 7 is assembled to the member 13 as just described the outer surface of head portion 9 extends to at least, and preferably slightly beyond, the inside surface 16 of the member 13 for reasons which will become apparent hereinafter.

The shank portion 8 of body 7 is secured against rotation in the opening 14. This may be provided in any suitable manner and is shown as being accomplished by forming the shank portion 8 with a key 17 which fits into a keyway 18 in the opening 14. It will be understood, however, that shank portion 8 may be formed in any of a wide variety of configurations all of which, in cooperation with a suitably mating opening in the member 13, will achieve the desired result. Alternatively, the member 13 may be suitably molded to the body 7 to provide a unitary assembly if desired.

In order to increase the length of the electrical creepage path between the shank portion 8 and the heatsink 5, the outer surface 19 of member 13 is provided with one or more upstanding annular fins shown at 20 and 21. Also, to reduce voltage concentrations, the head portion 9 of body 7 is provided with rounded corners and is preferably of a "mushroom" configuration, as shown.

Annular member 13 is arranged to be secured to heatsink 5 so that the head portion 9 of the body 7 is in thermally conducting, electrically insulated relationship therewith. This is conveniently accomplished by securing annular member 13 to heatsink 5 by circumferentially disposed screws 22 which fit into threaded inserts 23. If desired, screws 22 may be formed of a suitable electrically nonconducting material, such as nylon.

It is also desirable, especially for the higher voltage applications, to provide a seal between the inside surface 16 of member 13 and the surface of heatsink 5 to which it is mounted. Alternatively this is conveniently provided, as shown, by an annular sealing ring 24 of a suitable resilient, electrically nonconducting material, such as a synthetic rubber, which is disposed in the space between the head portion 9 of body 7 and the region defined by the lateral wall of counterbore 15 and the surface of heatsink 5. It will be apparent, therefore, that the head portion 9 of body 7 is forced tightly against the layer of insulating material 12 when the member 13 is secured to the surface of heatsink 5 and is thus electrically insulated therefrom and in thermal conducting relationship therewith. Also the semiconductor device 1 may be removed and replaced as desired merely by removing it from the threaded bore 10 without in any way whatsoever disturbing the layer 12 of electrically insulating material. Thus, a very fragile material, such as mica which exhibits such extremely good electrical insulating properties, may be readily utilized.

Figures 3, 4:
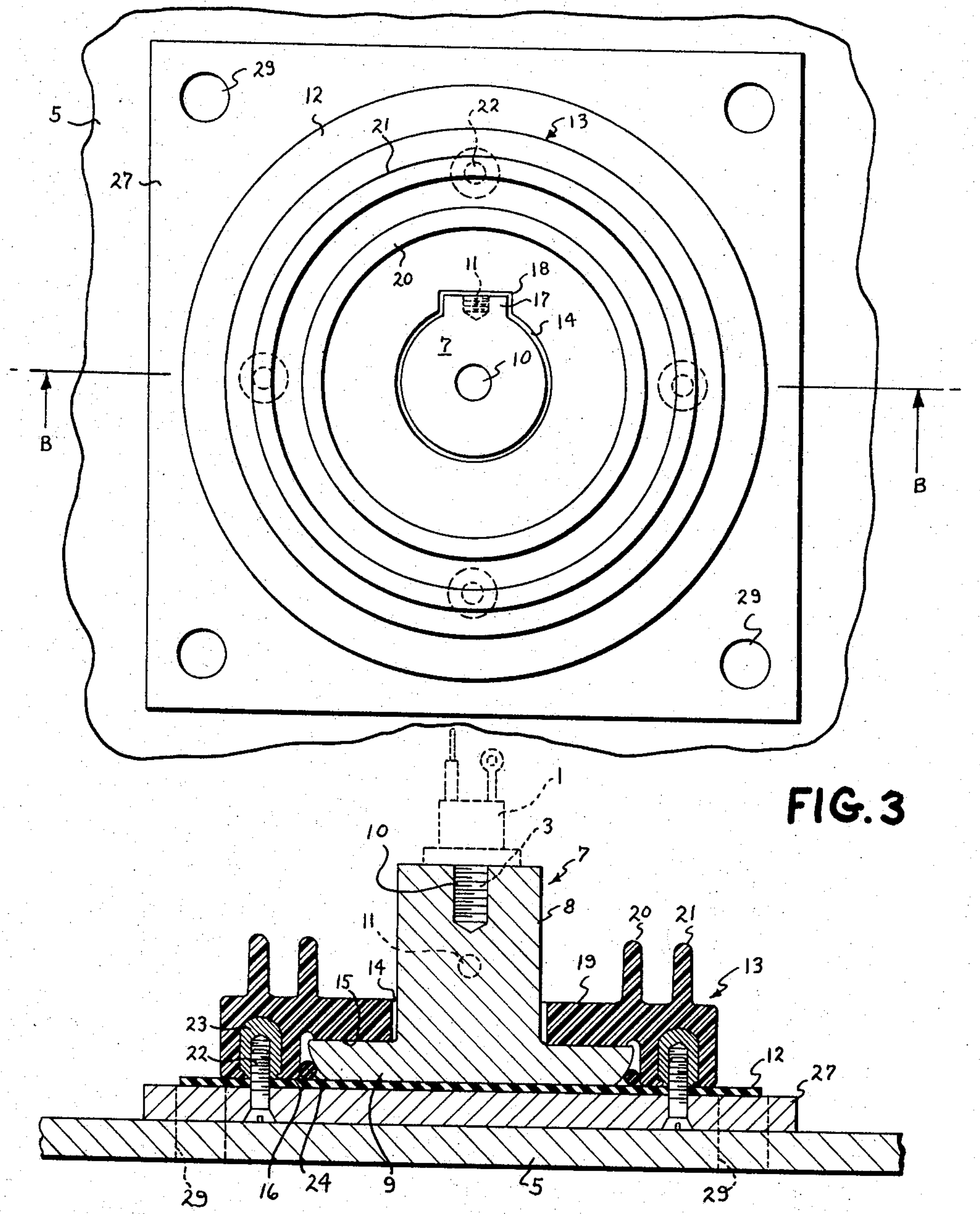
FIGURE 3 is a top view of another embodiment of the present invention.
FIGURE 4 is a sectional view taken along the line B—B of FIGURE 3.

In FIGURES 3 and 4 there is shown another embodiment of the invention wherein the body 7 and annular member 13 are arranged to provide a unitary assembly. This is provided by mounting the annular member 13 to a base member of high thermally conducting material, such as copper, aluminum or the like, which in turn is adapted to be mounted in intimate thermal contact with a suitable heatsink.

As shown, the body 7 is positioned within the annular member 13 as described in connection with FIGURES 1 and 2 and the member 13 secured to a base member 27 by the circumferentially disposed screws 22. Base member 27 is adapted to be mounted to a suitable beatsink 5 and for this purpose holes 29 are provided so that base member 27 may be bolted or otherwise suitably secured to the heatsink. Since ultimately the heat developed in semiconductor device 1 must be transferred to the heatsink through base member 27, this base member must be constructed of a high thermally conducting material similar to that utilized for the body 7.

With the foregoing arrangement a complete semiconductor mounting unit may be readily installed in a desired electrical apparatus without danger of disturbing the electrical insulating or thermal conducting relationship between the base member 27 and the body 7. Moreover, the seal between the surface of annular member 13 and the head portion 9 of body 7 can be very accurately formed and tested during manufacture of the assembly and such seal will remain unaffected during the mounting or changing of a mounting unit in the electrical apparatus.

Thus, it can be seen that with the present invention it is possible to approach an infinite heatsink wherein a semiconductor device is electrically isolated from the heatsink in such a manner that when the semiconductor device must be repaired or replaced, it is unnecessary to disturb the insulating material which provides the electrical isolation between the heatsink and the semiconductor device. Further, this arrangement also provides a large contact surface with the heatsink resulting in maximum heat transfer from a semiconductor device to the heatsink.

While we have shown and described only certain embodiments of the present invention, it will be obvious to those skilled in the art that various changes and modifications may be made without departing from the present invention in its broader aspects and therefore, it is the intention of the appended claims to cover all such changes and modifications as may fall within the true spirit and scope of the present invention.

What we claim as new and desire to secure by Letters Patent of the United States is:

1. In an arrangement for mounting a semiconductor device on a heat dissipating means, the combination comprising:

(a) an electrically nonconducting member having an opening therethrough;

(b) a body of thermally conducting material having a shank portion and a head portion, said shank portion projecting through the opening in said nonconducting member and secured therein against rotation and said head portion overlying said opening;

(c) means for removably mounting a semiconductor device on said shank portion in intimate thermal contact therewith for transferring heat developed in said device to said body; and (d) means securing said nonconducting member to a heat dissipating means and holding the head portion of said body in thermally conducting, electrically insulated relationship with said heat dissipating means.

2. In an arrangement for mounting a semiconductor device on a heat dissipating means, the combination comprising:

(a) an eletctrically nonconducting member having an opening therethrough, an outside surface and an inside surface having a counter bore therein;

(b) a body of thermally conducting material having a shank portion and a head portion, said body being positioned in said nonconducting member with said shank portion projecting through said opening and secured therein against rotation and said head portion disposed in said counter bore with an exposed surface extending at least to an inside surface of said nonconducting member;

(c) means for removably mounting a semiconductor device on said shank portion in intimate thermal contact therewith for transferring heat developed in said semiconductor device to said body; and (d) means securing said nonconducting member to a heat dissipating means and holding the head portion of said body in thermally conducting electrically insulating relationship with said heat dissipating means.

3. The arrangement of claim 2 including means for effecting a seal between the inside surface of said nonconducting member and said heat dissipating means.

4. The arrangement of claim 2 wherein the outside surface of said nonconducting member comprises means for increasing the electrical leakage path between the shank portion of said body and said heat dissipating means.

5. In an arrangement for mounting a semiconductor device on a heat dissipating means, the combination comprising:

(a) an electrically nonconducting member having an opening therethrough;

(b) a body of thermally conducting material having a shank portion and a head portion, said shank portion projecting through the opening in said nonconducting member and secured therein against rotation and said head portion overlying said opening;

(c) means for removably mounting a semiconductor device on said shank portion in intimate thermal contact therewith for transferring heat developed in said device to said body;

(d) a base member of thermally conducting material;

(e) a layer of electrically insulating material disposed on one surface of said base member;

(f) means securing said base member to said nonconducting member with the head portion of said body in intimate contact with said layer of electrically insulating material and with said head portion in thermally conducting, electrically insulated relationship with said base member;

(g) and means for mounting said base member on a heat dissipating means.

6. In an arrangement for mounting a semiconductor device on a heat dissipating means, the combination comprising:

(a) an electrically nonconducting member having an opening therethrough, an outside surface and an inside surface having a counter bore therein;

(b) a body of thermally conducting material having a shank portion and a head portion, said body being positioned in said nonconducting member with said shank portion projecting through said opening and secured therein against rotation and said head portion disposed in said counter bore with the exposed surface of said head portion extending at least to an inside surface of said nonconducting member;

(c) means for removably mounting a semiconductor device on said shank portion in initimate thermal contact therewith for transferring heat developed in said semiconductor device to said body;

(d) a base member of thermally conducting material;

(e) a layer of electrically insulating material disposed on one surface of said base member;

(f) means securing said base member to said nonconducting member with the head portion of said body in intimate contact with said layer of electrically insulating material and with said head portion in thermally conducting, electrically insulated relationship with said base member; and (g) means for mounting said base member on a heat dissipating means.

7. The arrangement of claim 6 including means for effecting a seal between said inside surface of said nonconducting member and said base member.

8. A heatsink for dissipating heat generated in a semiconductor device comprising:

(a) means for dissipating heat;

(b) a key-shaped cylinder of thermally conducting material, said cylinder having at one end thereof a mushroom-shaped flange secured in thermal contact with said heat dissipating means and at the opposite end thereof having a threaded bore for receiving a threaded stud for mounting a semiconductor device thereon;

(c) a sheet of electrical insulating material disposed between said flange and said heat dissipating means; and (d) an annular electrically insulating ring having a plurality of raised annular fins on one surface thereof said annular electrically insulating ring having the opposite surface thereof engaging the mushroom-shaped flanges of said cylinder and securing said flange to said heat dissipating means for providing a thermal connection therebetween, said insulating ring having a keyhole-shaped aperture therethrough and said cylinder having a formation fitting therein for securing said cylinder to said heat dissipating means against rotation relative to said ring.

9. A heatsink for a semiconductor device comprising:

(a) means for dissipating heat;

(b) a mounting plate of a thermally conducting material removably mounted on said heat dissipating means, said mounting plate being in heat transfer relationship to said heat dissipating means;

(c) a key-shaped cylinder for removably mounting the semiconductor device on said mounting plate, said cylinder having at one end thereof a mushroom-shaped flange in thermal contact with said mounting plate and at the opposite end thereof having a threaded bore for receiving a threaded stud upon which the semiconductor device is mounted;

(d) a sheet of electrically insulating material disposed between said flange and said mounting plate for providing electrical isolation therebetween; and (e) an annular insulating ring having a plurality of raised annular fins on the surface thereof, said annular insulating ring having the opposite surface thereof engaging the underside of the mushroom-shaped flange on said cylinder and connecting said cylinder to said mounting plate for providing a thermal connection therebetween, said insulating ring having a keyhole-shaped aperture therethrough and said cylinder having a formation fitting therein for preventing rotation and positively locating said cylinder on said mounting plate.

10. The arrangement of claim 4 wherein said means for increasing the electrical leakage path between the shank of said body and said heat dissipating means comprises circular ribs.

References Cited

UNITED STATES PATENTS

| | | | |
|---|---|---|---|
| 2,730,663 | 1/1956 | Harty | 317—234 |
| 2,754,455 | 7/1956 | Pankove | 317—234 |
| 2,984,077 | 5/1961 | Gaskill | 62—3 |
| 2,994,203 | 8/1961 | Lackey et al. | 317—100 |
| 3,248,471 | 4/1966 | Danchuk et al. | 174—15 |

JAMES D. KALLAM, *Primary Examiner.*